(12) United States Patent
Richards et al.

(10) Patent No.: US 6,815,696 B2
(45) Date of Patent: Nov. 9, 2004

(54) BEAM STOP FOR USE IN AN ION IMPLANTATION SYSTEM

(75) Inventors: Steven Richards, Georgetown, MA (US); Christopher Berry, Exeter, NH (US); William Leavitt, Haverhill, MA (US)

(73) Assignee: Ibis Technology Corporation, Danvers, MA (US)

( * ) Notice: Subject to any disclaimer, the term of this patent is extended or adjusted under 35 U.S.C. 154(b) by 0 days.

(21) Appl. No.: 10/157,947

(22) Filed: May 29, 2002

(65) Prior Publication Data

US 2003/0222227 A1 Dec. 4, 2003

(51) Int. Cl.[7] .............................................. H01L 21/00
(52) U.S. Cl. .................. 250/492.21; 438/694; 438/667
(58) Field of Search ........................ 250/492.21, 492.2, 250/398, 281; 438/694, 667, 700, 795; 364/488, 357

(56) References Cited

U.S. PATENT DOCUMENTS

| | | | |
|---|---|---|---|
| H235 H | * 3/1987 | Kugel et al. ................ 376/143 |
| 4,743,767 A | * 5/1988 | Plumb et al. ............ 250/492.2 |
| 5,053,627 A | 10/1991 | Ruffell et al. |
| 6,093,456 A | 7/2000 | England et al. |
| 6,100,199 A | * 8/2000 | Joshi et al. ................. 438/694 |
| 6,458,723 B1 | * 10/2002 | Henley et al. .............. 438/795 |

* cited by examiner

*Primary Examiner*—John R. Lee
*Assistant Examiner*—Zia R. Hashmi
(74) *Attorney, Agent, or Firm*—Thomas J. Engellenner; Reza Mollaaghababa; Nutter McClennen & Fish LLP

(57) ABSTRACT

The present invention provides a beam stop for use in an ion implantation system that includes a base formed of a thermally conductive material, and a heat transfer layer formed of a semi-elastic material that is disposed on a surface of the base. The beam stop further includes one or more tiles, each formed of a thermally conductive refractory material, that are disposed on the semi-elastic layer so as to face an ion beam in the implantation system. The heat transfer layer transfers heat generated in the tile in response to ion beam impact to the base. The base in turn can be coupled to a heat sink to remove heat from the base. The thickness and the thermal conductivity of the base, and those of the heat transfer layer and the tile are chosen so as to ensure uniform expansion of the base and the tile when the beam stop is heated by ion beam impact.

20 Claims, 5 Drawing Sheets

BEAM STOP FOR USE IN AN ION IMPLANTATION SYSTEM

BACKGROUND OF THE INVENTION

The present invention relates generally to ion implantation systems, and more particularly, to beam stops that serve to absorb the energy of an ion beam.

Beam stops are routinely utilized in ion implantation systems to intercept those portions of an ion beam directed towards a target, e.g., a semiconductor wafer, that do not impinge upon the target. The beam stop is typically incorporated into the end station of an ion implantation system, lying beneath or behind the wafers that are held in the beam path by the end station. The impact of ions on the beam stop typically causes a loss of material from the beam stop surface via a process commonly known as sputter erosion. This sputtered material can deposit on various surfaces of an evacuated chamber of the implantation system, including those of the wafers, thereby contaminating these surfaces. Performance of semiconductor devices formed on processed wafers can be adversely affected even by small amounts of contamination. For example, contamination of silicon wafers by metals or alkali metals is particularly pernicious.

Accordingly, beam stops are preferably formed from materials that exhibit low sputter erosion rates and/or eject sputter products that are less likely to contaminate the wafers. One such beam stop material is silicon, since the ejected silicon is less likely to adversely affect wafers of like composition. However, forming an entire beam stop from a material, such as silicon, that does not cause significant contamination is often impractical. The typical high current ion implanter can subject a beam stop to high power levels, for example, in a range of 5 kW to 15 kW. A beam stop that is exposed to such high power levels needs to be efficiently cooled but the brittle and refractory nature of silicon make it difficult to construct passageways for circulation of cooling fluid in the silicon itself.

Thus, the typical silicon beam stop needs to be coupled to a base, formed from a metal or similar material, which can be machined for cooling ducts and readily cooled. However, the exposure of the beam stop to high power levels can render bonding of the tiles to the base difficult. Further, the differences between the thermal expansion of the silicon relative to the base can exert substantial strain/stress forces on the silicon. These stress/strain forces can lead to mechanical failures, such as fractures, of the silicon tile that is exposed to the beam.

Accordingly, there is a need for beam stops that can be used in ion implantation systems without causing contamination.

There is also a need for beam stops that can withstand exposure to high power levels in ion implantation systems.

SUMMARY OF THE INVENTION

The present invention provides a beam stop for use in an ion implantation system that can employ multiple tiles to cover the beam-receiving surface. The beam stop further includes a base formed of a thermally conductive material, and a heat transfer layer formed of a semi-elastic material that is disposed on a surface of the base. The beam stop's surface includes one or more tiles, each formed of a thermally conductive refractory material, that are disposed on the semi-elastic, heat transfer layer so as to face an ion beam in the implantation system. The heat transfer layer transfers heat generated in the tiles, in response to ion beam impact, to the base. A heat sink, e.g., a cooling fluid, coupled to the base removes heat from the base.

In another aspect, the thickness and the thermal conductivity of the base, and those of the heat transfer layer and the tiles are chosen so as to ensure uniform expansion of the base and the tiles when the beam stop is heated by ion beam impact This aspect of the invention is applicable to most "single tile" and "multi-tile" structures.

In a related aspect, the thermal expansion coefficients of the base and the tile, and their respective thermal conductivity, together with the width of the heat transfer layer, are selected such that a temperature change of the tile ($\Delta T_t$), in response to heat generated by ion impact, is related to a corresponding temperature change of the base ($\Delta T_b$) in accord with the relation:

$$(\Delta T_t)\alpha_t = (\Delta T_b)\alpha_b$$

wherein $\alpha_t$ and $\alpha_b$ represent thermal expansion coefficients corresponding to the tile and the base, respectively.

In one embodiment, the base can include at least one inner passageway that allows a cooling fluid, such as, water, to circulate through the base to remove heat that is transferred to the base via the heat transfer layer. The passageway can be formed, for example, as a channel at a selected depth below a surface of the base that is in contact with the heat transfer layer.

In further aspects, the invention provides a beam stop as described above in which the tiles and the base are formed of silicon and aluminum, respectively, and a silver-filled epoxy is utilized as the heat transfer layer. The aluminum base can include a channel for fluid circulation, formed therein at a depth in a range of about 0.002 to about 0.006 inches (0.015 cm) below a surface of the base that is in contact with the epoxy layer. Those having ordinary skill in the art will appreciate that other metallic materials, such as, titanium, nickel, copper, silver and various metal alloys, can be utilized for forming the base, and other conductive refractory materials, such as, graphite or germanium, can be employed for forming the tiles.

In other aspects, the invention provides a magnetically suppressed or an electrically suppressed Faraday cup that utilizes a beam stop according to the teachings of the invention. For example, such a Faraday cup can include a beam stop of the invention and a magnet that is coupled to the beam stop so as to maintain an electrically conductive path thereto. The magnet generates a magnetic field in a space above the tiles so as to capture secondary electrons that are emitted by the beam stop in response to the ion beam impact. The Faraday cup further includes an insulator coupled to the magnet for providing electrical insulation of the cup, and a circuitry coupled to the beam stop for measuring a current induced by ions absorbed by the beam stop.

In a related aspect, the invention provides an electrically suppressed Faraday cup in which a beam stop according to the teachings of the invention is electrically biased, for example, by a voltage source, so as to generate an electric field in a space above the tiles in a manner that the interaction of the secondary electrons emitted by the beam stop with the field causes the return of these electrons back to the beam stop. An electrical circuit can be provided to measure a current induced as a result of absorbance of ions incident on the beam stop.

Further understanding of the invention can be obtained by reference to the following detailed description in conjunction with the drawings which are briefly described below.

DETAILED DESCRIPTION

Figure 1:
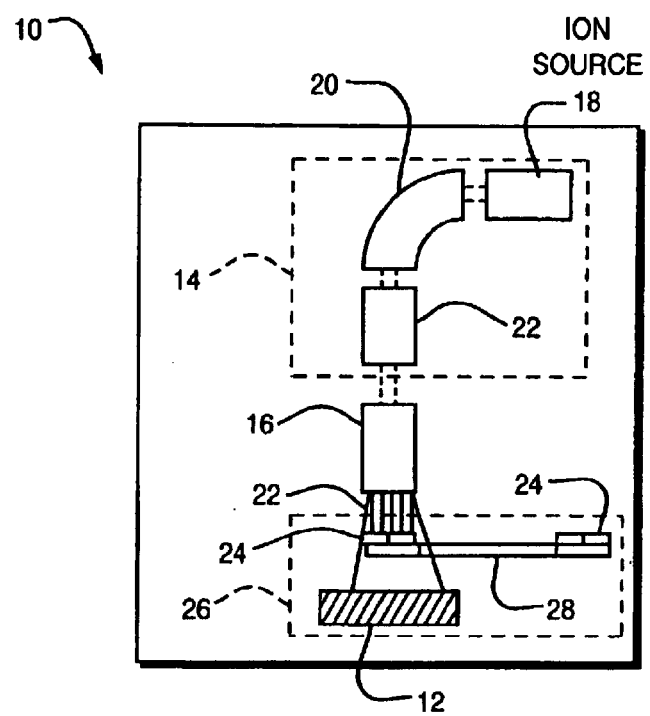
FIG. 1 schematically illustrates an ion implantation apparatus in which a beam stop in accordance with the teachings of the invention is utilized.

FIG. 1 illustrates an exemplary ion implantation apparatus 10 in which a beam stop 12 according to the teachings of the invention is utilized. The ion implantation system 10 includes a beam delivery assembly 14 and a beam-forming device 16. The beam delivery assembly 14 can include an ion source 18 that generates a beam of ions. The beam delivery assembly 14 can further include an ion analyzer 20, such as, a magnetic analyzer, that selects appropriately charged ions. An accelerator 22 accelerates the selected ions to a desired energy, e.g., about 200 keV, and the beam-forming device 16 shapes the accelerated ions into an ion beam 22 having a selected cross-sectional shape and area.

Figure 2:
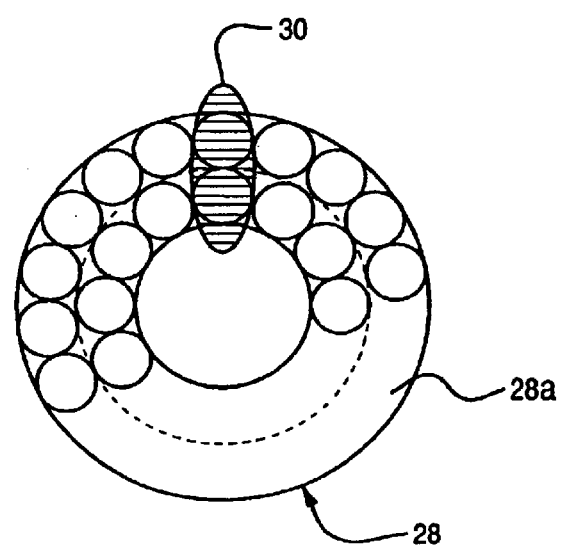
FIG. 2 is a top view of an exemplary annular support structure for holding a plurality of wafers in a path of an ion beam in the ion implantation apparatus of claim 1 and an exposure zone associated with an ion beam directed to the wafers.

The beam 22 is directed to a plurality of targets 24, e.g., semiconductor wafers, to implant a selected dose of ions therein. In this exemplary embodiment, the targets are disposed in an end-station 26 on a rotating support structure or end station 28. A drive mechanism (not shown) can rotate the support structure to sequentially expose one or more of the wafers 24 to the ion beam 22. For example, as shown in FIG. 2, the exemplary support structure 28 can include an annular portion 28a on which the wafers are disposed. An exposure zone 30 associated with the beam 22 covers, at each orientation of the support structure 28, two wafers disposed side-by-side along a radial direction of the support structure. The exposure zone 30 can, however, extend beyond the cross-sectional area presented by the targets to the beam 22. Hence, a portion of the beam 22 may not be intercepted by the targets.

Referring again to FIG. 1, a beam stop 12 according to the teachings of the invention is disposed in the end-station 26 behind the support structure 28 to capture those ions in the ion beam that are not intercepted by the targets. The beam stop 12 is preferably stationary and can function not only as an energy absorber, but also as a component of a Faraday cup for measuring a current associated with the portion of the ion beam not intercepted by the targets, as discussed in detail below.

Figure 3:
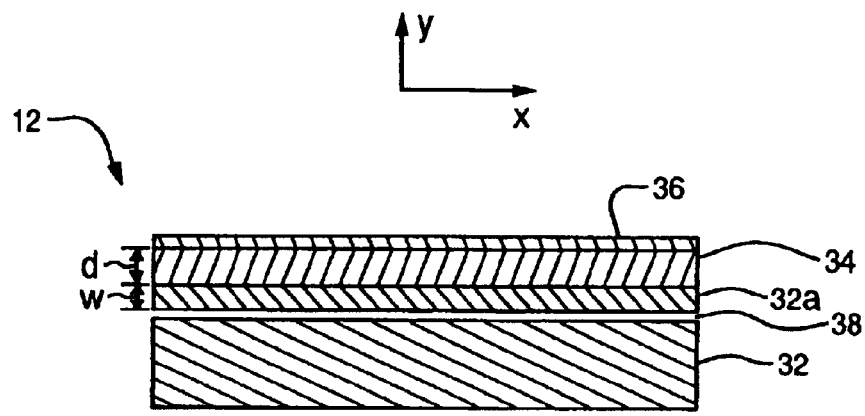
FIG. 3 is a cross-sectional view of an exemplary beam stop according to the teachings of the invention having a three-layer structure composed of a heat transfer layer that is sandwiched between a plurality of silicon tiles and an aluminum base.

FIG. 3 schematically depicts an exemplary embodiment of the beam stop 12, formed in accordance with the teachings of invention, that includes a metallic base 32 formed, for example, of aluminum and a heat transfer layer 34, having a width d, that is sandwiched between the base 32 and a plurality of silicon tiles 36. The silicon tiles are shaped and sized such that they collectively present a cross-sectional area to the beam that is substantially the same as the cross-sectional area of a surface 32a of the base in contact with the heat transfer layer 34. That is, the plurality of the silicon tiles 36 substantially cover the entire surface of 32a of the base 32.

The base 32 includes an inner passageway 38, in the form of a channel, that allows circulation of a cooling fluid (not shown), for example, water, through the base. The cooling fluid functions as a heat sink for removal of the heat transferred to the base from the tiles 36, via the heat transfer layer 34, when the beam stop is heated by ion beam impact. In this exemplary embodiment, the channel 38 is formed at a selected depth W below a top surface 32a of the base 32.

The intermediate layer 34 is preferably formed of a semi-elastic material that is thermally conductive. The coefficient of thermal conduction of the layer 34 preferably lies in a range of about 1 to about 10 Watts/(meter degree K). An example of a semi-elastic material suitable for use in the present invention is silver-filled epoxy, such as, Duralco 125 sold by Cotronics Corporation of Brooklyn, N.Y., U.S.A. The width d of the thermal transfer layer 34 can be selected in conjunction with other thermal parameters of the beam stop, such as, thermal conductivity of the tiles and the base, and coefficients of thermal expansion of the tiles and base such that the tiles and the base expand uniformly in response to heat generated by ion impact. For example, in one embodiment, the width d is in a range of about 0.05 to about 0.2 millimeters.

In this illustrative embodiment, the layer 34, formed of a silver-filled epoxy, functions not only as an adhesive but it also allows transfer of heat generated in the tiles, as result of ion impact, to the base 32. The heat generated in the base 32 is in turn removed by cooling fluid circulating through the channel 38. The width, and the thermal conductivity of the heat transfer layer 34, the coefficient of thermal expansion of the tiles 36 and that of the base 32, and the position of the channel 38, e.g., the depth W, are selected so that the tiles and the base expand substantially uniformly in response to heat generated by ion impact. In other words, these parameters are selected such that temperature change of the tiles ($\alpha T_t$), in response to heat generated by ion impact, is related to a corresponding temperature change of the base ($\Delta T_b$) in accord with the relation:

$$(\Delta T_t)\alpha_t = (\Delta T_b)\alpha_b \quad (1)$$

wherein $\alpha_t$ and $\alpha_b$ represent thermal expansion coefficients of the tiles and the base, respectively. The uniform expansion advantageously minimizes strain/stress forces exerted on the tiles, thereby inhibiting fracture of the tiles. (As used herein, the term "uniform expansion" and the equality set forth in Equation (1) above is satisfied so long as the average thermal expansion of the tiles is the same as that of the base within plus or minus five percent.)

In one embodiment, the base 32 is formed of aluminum and the tiles are formed of silicon. Further, the channel 38 is disposed at a distance of approximately 0.006 inches (0.015 cm) beneath a surface of the base that is in contact with heat transfer layer 34. The heat transfer layer, formed of silver-filled epoxy, transfers heat generated in the tiles to the base, and a cooling fluid circulating through the channel 38 removes heat from the base such that the thermal expansion of the base in a direction (x) is substantially equal to a linear thermal expansion of the tile along the same direction, thereby minimizing strain/stress forced on the tiles.

A beam stop of the invention, such as the exemplary beam stop 12, can be utilized in an ion implantation apparatus to intercept ions having different energies and beam fluence. For example, the beam stop can be employed for beam energies in a range of about 10 keV to about 250 keV, and beam fluence values in a range of about 10 mA to about 100 mA. In addition, the use of a plurality of tiles rather than a single large tile for ion interception can significantly lower the cost of manufacturing the beam stop.

Although in the above exemplary embodiment, the base and the tiles are formed of aluminum and silicon, respectively, and the heat transfer layer is formed of a silver-filled epoxy, those having ordinary skill in the art will appreciate that other materials can be utilized in forming a beam stop of the invention so long as the various thermal parameters of the base, the tiles, and the heat transfer layer are selected in a manner that the tiles and the base expand substantially uniformly in response to heat generated by ion impact.

Figure 4:
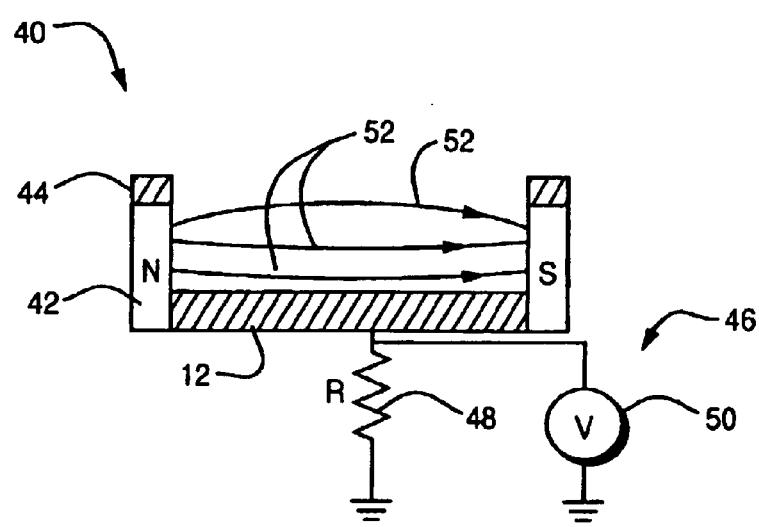
FIG. 4 is a schematic cross-sectional view of a magnetically suppressed Faraday cup according to the teachings of the invention.

In an ion implantation apparatus, a beam stop can be utilized not only to intercept those ions that miss a target, but it can also be incorporated in a Faraday cup to measure a current associated with these ions. For example, FIG. 4 illustrates a magnetically suppressed Faraday cup 40 that includes a beam stop 12 according to the teachings of the invention, and a magnet 42, having a North pole and a South pole, that is in electrical conduction with the beam stop 12, for example, via the base 32 (FIG. 3). An insulator 44 coupled to the magnet 42 provides electrical insulation of the Faraday cup. Further, an exemplary electrical circuit 46 that consists of a resister 48 coupled between ground and the beam stop 12 and a voltmeter 50 measures the current induced in the resistor 48 as a result of accumulation of electrical charge on the beam stop from ion impact. In the absence of magnetic suppression, the charging of the beam stop can be caused not only by absorption of ions in the beam that strike the beam stop, but also as a result of loss of secondary electrons generated by such ion impact. The loss of these secondary electrons can result in inaccurate measurement of the ion current incident on the beam stop. In the Faraday cup 40, however, a magnetic field, characterized by a set of field lines 52, generated by the magnet over the beam stop captures these secondary electrons and directs them to the magnet. The capture of these electrons by the magnet, which is in electrical conduction with the beam stop, offsets the secondary electron loss from the beam stop. Hence, accurate measurements of a current of the ion beam incident on the beam stop can be obtained.

Figure 5A:
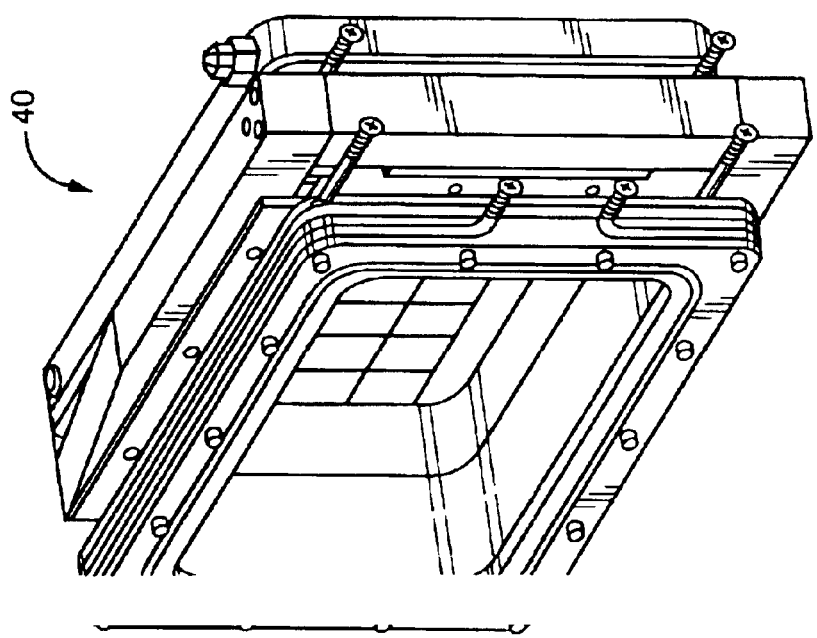
FIG. 5A is a perspective view of an embodiment of the magnetically suppressed Faraday cup of FIG. 4.
Figure 5B:
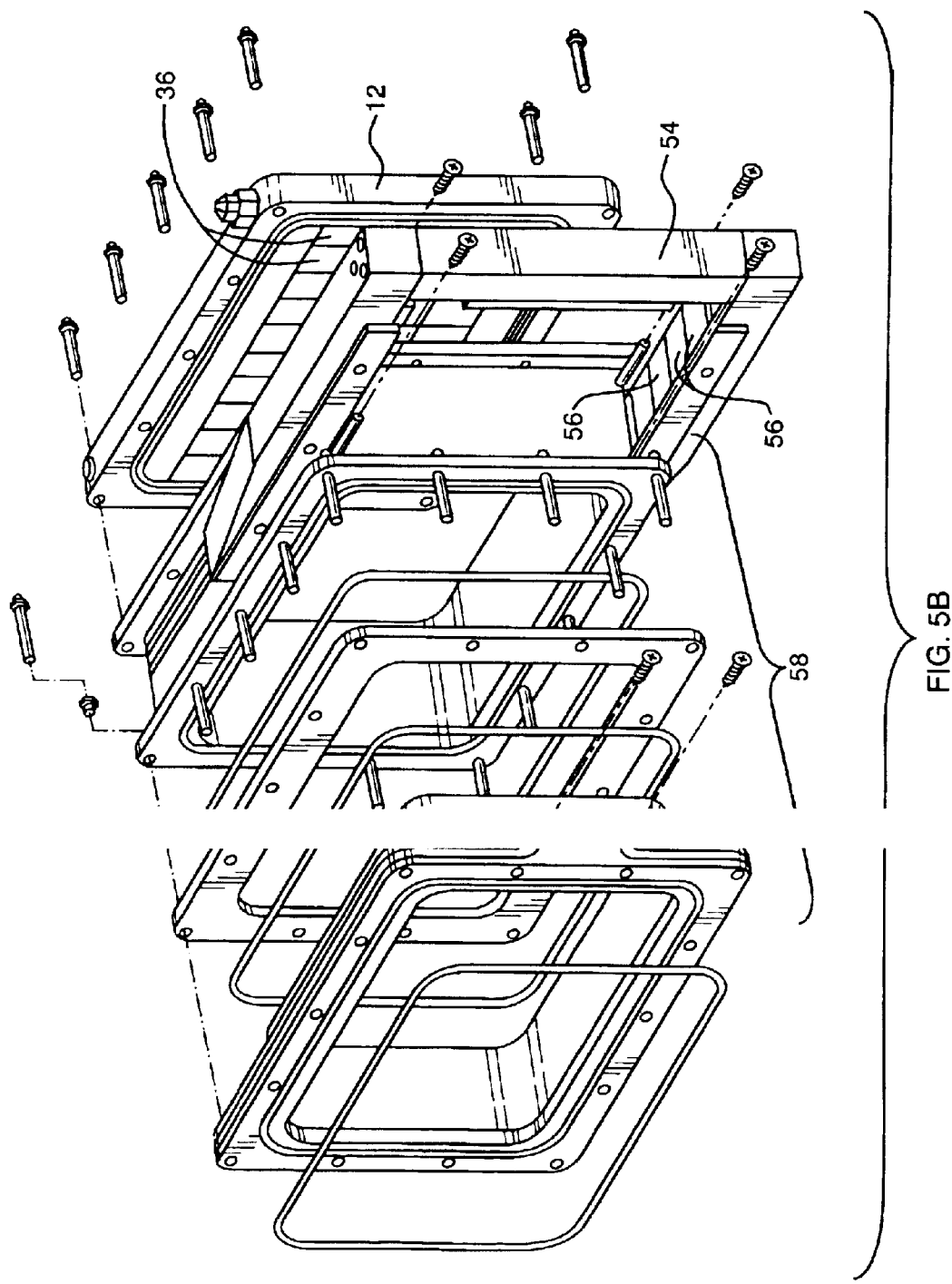
FIG. 5B is an exploded perspective view of the Faraday cup of FIG. 5A.

FIGS. 5A and 5B illustrate an exemplary implementation of the magnetically suppressed Faraday cup 40 having a beam stop 12 with a plurality of tiles 36 facing an ion beam in an ion implantation system. A structure 54 houses a set of magnets 56 in a lower portion thereof and a similar set of magnets (not shown) in an upper portion thereof, such that a pole of a magnet in the lower set faces an opposite pole of a magnet in the upper set to generate magnetic field lines in a plane parallel to the tiles 36. A plurality of additional members 58 provide insulation and further allow mechanical coupling of the Faraday cup to other components of the ion implantation system.

Figure 6:
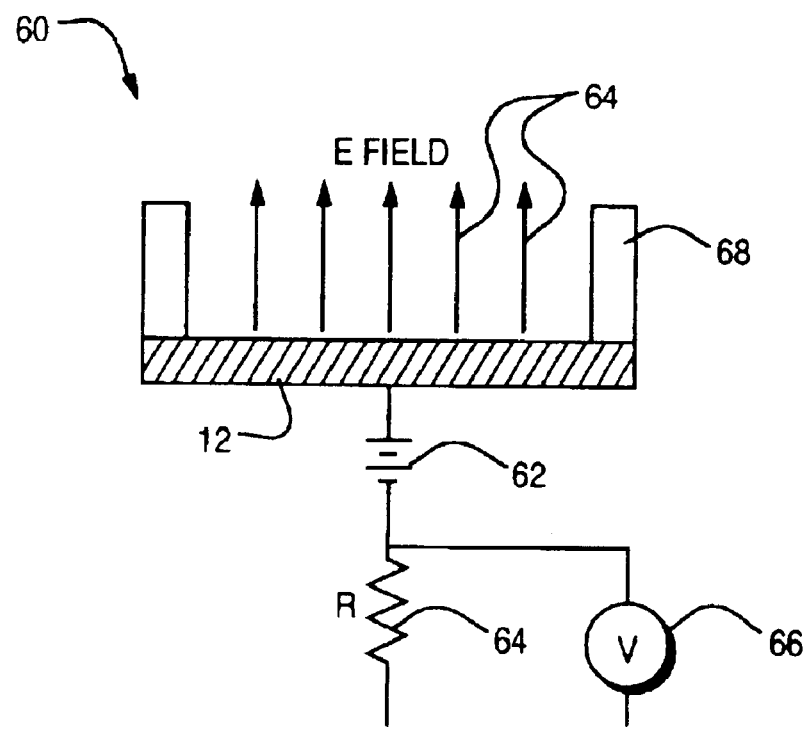
FIG. 6 is a schematic cross-sectional view of an electrically suppressed Faraday cup according to the teachings of the invention.

FIG. 6 schematically illustrates an exemplary electrically suppressed Faraday cup 60 that includes a beam stop 12 in accordance with the teachings of the invention which is electrically biased by a voltage source 62 so as to generate an electrical field, characterized by field lines 64, above the beam stop. The electrical field causes return of secondary electrons, emitted by the beam stop in response to ion impact, to the beam stop, thereby allowing an electrical circuitry formed of a resistor 64 and a voltmeter 66 to accurately measure a current induced by the absorbance of the ions by the beam stop 12. Further, an insulating structure 68 provides electrical insulation of the beam stop 12.

Those having ordinary skill in the art will appreciate that various modifications can be made to the above embodiments without departing from the scope of the claimed invention as described by appended claims.

What is claimed is:

1. A beam stop for use in an ion implantation system, comprising
   a base formed of a thermally conductive material adapted for coupling to a heat sink for removing heat from the base,
   a heat transfer layer of a semi-elastic material disposed on a surface of said base, and
   at least one tile formed of a thermally conductive refractory material disposed on said semi-elastic layer so as to face an ion beam in said implantation system.

2. The beam stop of claim 1, wherein the thickness and conductivity of the base, the heat transfer layer, and the tile are chosen to ensure uniform expansion of the base and the tile when the beam stop is heated by ion beam impact.

3. The beam stop of claim 2, wherein a temperature change of the tile ($\Delta T_t$), in response to heat generated by ion impact, is related to a corresponding temperature change of the base ($\Delta T_b$) in accord with the relation:

$$(\Delta T_t)\alpha_t = (\Delta T_b)\alpha_b$$

wherein $\alpha_t$ and $\alpha_b$ represent thermal expansion coefficients corresponding to the tile and the base, respectively.

4. The beam stop of claim 1, wherein the base further comprises at least one inner passageway for a cooling fluid circulation.

5. The beam stop of claim 4, wherein said passageway is formed in the base at a selected distance below a surface of the base on which the heat transfer layer is disposed.

6. The beam stop of claim 5, wherein said distance is selected to be in a range of about 0.002 to about 0.006 inches.

7. The beam stop of claim 1, wherein the base is formed of any of aluminum, copper, titanium, silver, or nickel.

8. The beam stop of claim 7, wherein the semi-elastic layer is formed of silver filled epoxy.

9. The beam stop of claim 8, wherein the tile is formed of silicon.

10. The beam stop of claim 7, wherein the width of the semi-elastic layer is in a range of about 0.05 to about 0.2 millimeters.

11. A beam stop for use in an ion implantation system, comprising
    a base formed of a thermally conductive material adapted for coupling to a heat sink for removing heat from the base,
    a heat transfer layer formed of a semi-elastic material disposed on a surface of said base, and
    a plurality of tiles formed of a thermally conductive refractory material disposed on said semi-elastic layer so as to face an ion beam in said implantation system, said plurality of tiles substantially covering an entirety of the surface of said base on which the heat transfer layer is disposed.

12. The beam stop of claim 11, wherein the thickness and conductivity of the base, the heat transfer layer, and the tiles are chosen to ensure a substantially uniform expansion of the base and the tiles when the beam stop is heated by ion beam impact.

13. The beam stop of claim 12, wherein a temperature change of the tile ($\Delta T_t$), in response to heat generated by ion impact, is related to a corresponding temperature change of the base ($\Delta T_b$) in accord with the relation:

$$(\Delta T_t)\Delta_t = (\Delta T_b)\alpha_b$$

wherein $\alpha_t$ and $\alpha_b$ represent thermal expansion coefficients corresponding to the tiles and the base, respectively.

14. A beam stop for use in an ion implantation system, comprising:
a metallic base having a top surface and a bottom surface, said base having a passageway formed therein at a selected depth below the top surface for a cooling fluid circulation,
a semi-elastic heat transfer layer formed of a material having a selected coefficient of thermal conductivity and having a selected width disposed on the top surface of said metallic base, and
one or more silicon tiles disposed on said semi-elastic material so as to face an ion beam in said implantation system,
wherein the depth of the passageway, and the coefficient of thermal conductivity and the width of the semi-elastic material, and the thermal expansion coefficients of the base and the tiles are selected such that a change in a linear dimension of the silicon tiles is substantially similar to a change in a corresponding linear dimension of said metallic base when the beam stop is heated by the ion beam.

15. The beam stop of claim 14, wherein said base is formed of any of aluminum, silver, copper, titanium, or nickel.

16. The beam stop of claim 14, wherein said semi-elastic layer is formed of a silver-filled epoxy.

17. A magnetically suppressed Faraday cup for use in an ion implantation system, comprising
a beam stop comprising
a base formed of a thermally conductive material adapted for coupling to a heat sink for removing heat from the base,
a heat transfer layer of a semi-elastic material disposed on a surface of said base, and
at least one tile formed of a thermally conductive refractory material disposed on said semi-elastic layer so as to face an ion beam in said implantation system,
a magnet coupled to said beam stop and being in electrical conduction with said base, said magnet generating a magnetic field in a space above said tile so as to capture secondary electrons emitted by said beam stop in response to ion beam impact, and
an insulator coupled to said magnet for providing electrical insulation.

18. The Faraday cup of claim 17, further comprising an electrical circuit electrical coupled to said beam stop for measuring a current induced by ion beam impact.

19. An electrically suppressed Faraday cup for use in an ion implantation system, comprising
a beam stop comprising
a base formed of a thermally conductive material adapted for coupling to a heat sink for removing heat from the base,
a heat transfer layer of a semi-elastic material disposed on a surface of said base, and
at least one tile formed of a thermally conductive refractory material disposed on said semi-elastic layer so as to face an ion beam in said implantation system,
a voltage source electrically coupled to said base for biasing said beam stop so as to generate an electric field in a space above said tiles for returning secondary electrons generated by the beam stop in response to ion impact to the beam stop.

20. The Faraday cup of claim 19, further comprising an electrical circuit coupled to said beam stop for measuring a current induced by absorbance of ions incident on said beam stop.

* * * * *